United States Patent
Dai et al.

(10) Patent No.: US 10,930,886 B2
(45) Date of Patent: Feb. 23, 2021

(54) METHOD FOR MANUFACTURING OLED DISPLAY SCREEN AND OLED DISPLAY SCREEN

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Ke Dai, Beijing (CN); Zailong Mo, Beijing (CN); Xiaodong Zhao, Beijing (CN); Taoran Zhang, Beijing (CN)

(73) Assignees: BOE TECHNOLOGY GROUP CO., LTD., Beijing (CN); CHENGDU BOE OPTOELECTRONICS TECHNOLOGY CO.. LTD., Sichuan (CN)

( * ) Notice: Subject to any disclaimer, the term of this patent is extended or adjusted under 35 U.S.C. 154(b) by 68 days.

(21) Appl. No.: 16/222,043

(22) Filed: Dec. 17, 2018

(65) Prior Publication Data

US 2019/0305252 A1    Oct. 3, 2019

(30) Foreign Application Priority Data

Mar. 30, 2018    (CN) .......................... 201810276647.5

(51) Int. Cl.
*H01L 29/08*    (2006.01)
*H01L 51/52*    (2006.01)
(Continued)

(52) U.S. Cl.
CPC .......... *H01L 51/5256* (2013.01); *H01L 27/32* (2013.01); *H01L 51/56* (2013.01)

(58) Field of Classification Search
CPC ..... H01L 51/5256; H01L 27/32; H01L 51/56; H01L 51/5246; H01L 27/3244
See application file for complete search history.

(56) References Cited

U.S. PATENT DOCUMENTS

| | | | |
|---|---|---|---|
| 8,975,815 B2 * | 3/2015 | Prat ..................... | H01L 51/5246 313/512 |
| 9,632,487 B2 * | 4/2017 | Kim ..................... | H01L 27/3258 |

(Continued)

FOREIGN PATENT DOCUMENTS

| | | |
|---|---|---|
| CN | 103594485 A | 2/2014 |
| CN | 105374946 A | 3/2016 |

(Continued)

OTHER PUBLICATIONS

First Office Action for Chinese Application No. 201810276647.5, dated Apr. 24, 2020, 10 Pages.

*Primary Examiner* — Caleb E Henry
(74) *Attorney, Agent, or Firm* — Brooks Kushman P.C.

(57) ABSTRACT

The present disclosure provides a method for manufacturing an OLED display screen and an OLED display screen. The method includes: providing a base substrate; forming OLED devices on the base substrate; forming a protection layer on the OLED devices; forming a cavity extending through the protection layer and a function layer of the OLED devices in a region where a through hole is to be formed; and forming a film encapsulation layer with the film encapsulation layer covering a lateral wall of the function layer of the OLED devices that defines the cavity.

8 Claims, 4 Drawing Sheets

(51) Int. Cl.
*H01L 27/32* (2006.01)
*H01L 51/56* (2006.01)

(56) References Cited

U.S. PATENT DOCUMENTS

| | | | |
|---|---|---|---|
| 10,403,645 B2 * | 9/2019 | Namkung | H01L 27/1225 |
| 10,497,900 B2 * | 12/2019 | Choi | H01L 51/0096 |
| 10,615,369 B2 * | 4/2020 | Choi | H01L 51/0097 |
| 2005/0116240 A1 * | 6/2005 | Kim | H01L 27/3244 |
| | | | 257/88 |
| 2007/0090457 A1 * | 4/2007 | Lee | H01L 29/78603 |
| | | | 257/347 |
| 2014/0049522 A1 * | 2/2014 | Mathew | H01L 51/5293 |
| | | | 345/204 |
| 2016/0190389 A1 * | 6/2016 | Lee | H01L 27/124 |
| | | | 257/93 |
| 2017/0031323 A1 * | 2/2017 | Kim | H01L 27/3258 |
| 2017/0148856 A1 * | 5/2017 | Choi | H01L 27/3258 |
| 2017/0288004 A1 * | 10/2017 | Kim | H01L 27/3276 |
| 2018/0123081 A1 * | 5/2018 | Baik | H01L 51/5209 |
| 2019/0051859 A1 * | 2/2019 | Choi | H01L 51/0097 |
| 2019/0123115 A1 * | 4/2019 | Sun | H01L 27/3225 |
| 2019/0148474 A1 * | 5/2019 | Bu | H01L 27/3276 |
| | | | 257/40 |

FOREIGN PATENT DOCUMENTS

| | | |
|---|---|---|
| CN | 107331797 A | 11/2017 |
| CN | 206877999 U | 1/2018 |
| CN | 107658332 A | 2/2018 |
| CN | 107731888 A | 2/2018 |
| CN | 107808896 A | 3/2018 |

* cited by examiner

METHOD FOR MANUFACTURING OLED DISPLAY SCREEN AND OLED DISPLAY SCREEN

CROSS-REFERENCE TO RELATED APPLICATION

This application claims priority to Chinese Patent Application No. 201810276647.5, filed on Mar. 30, 2018, which is incorporated herein by reference in its entirety.

TECHNICAL FIELD

The present disclosure relates to the field of display technologies, and in particular to a method for manufacturing an OLED display screen and an OLED display screen.

BACKGROUND

Organic light emitting diodes (OLEDs), which are also referred as organic electroluminescent diode devices, have attracted wide attention due to their advantages such as self-luminous, rich in color, fast responsibility, a wide viewing angle, light in weight, thin, less power consumption and flexible. Further, OLED display screens formed by the OLEDs are considered as display screens with great application prospects.

Currently, for display screens applied in mobile terminals such as mobile phones and tablet computers, full screens are an important development direction. However, when one full screen is applied in one mobile terminal, a through hole is usually defined through the full screen in a thickness direction of the full screen, for mounting a component such as a camera or a telephone receiver. When the full screen adopts the OLED display screen, it is necessary to form a through hole defined through the OLED display screen in a thickness direction of the OLED display screen. Function layers (i.e., a common electrode, an electron transfer layer, a hole transfer layer) of the OLED device in the OLED display screen may be exposed due to the presence of the through hole, and may be adversely affected by water and oxygen, resulting in poor display quality of the OLED display screen.

SUMMARY

One embodiment of the present disclosure provides a method for manufacturing an OLED display screen that includes: providing a base substrate; forming OLED devices on the base substrate; forming a protection layer on the OLED devices; forming a cavity through the protection layer and a function layer of the OLED devices in a region where a through hole is to be formed; and forming a film encapsulation layer with the film encapsulation layer covering a lateral wall of the function layer of the OLED devices that defines the cavity.

Optionally, the forming a cavity through the protection layer and a function layer of the OLED devices in a region where a through hole is to be formed, includes: using a dry etching process to form the cavity through the protection layer and the function layer of the OLED devices in the region where the through hole is to be formed.

Optionally, the forming a cavity through the protection layer and a function layer of the OLED devices in a region where a through hole is to be formed, includes: using an ashing process to form the cavity through the protection layer and the function layer of the OLED devices in the region where the through hole is to be formed.

Optionally, the forming a protection layer on the OLED devices includes: forming the protection layer on the OLED devices by a chemical vapor deposition process.

Optionally, the forming a protection layer on the OLED devices includes: form the protection layer on the OLED devices with the protection layer having a thickness in a range of from 100 nm to 300 nm.

Optionally, the forming a protection layer on the OLED devices includes: form the protection layer on the OLED devices with the protection layer made of inorganic material.

Optionally, the protection layer is made of at least one of silicon nitride, silicon oxide and silicon oxynitride.

Optionally, the forming a film encapsulation layer includes: forming a first encapsulation layer by a chemical vapor deposition process with a mask plate shielding the cavity and the first encapsulation layer being made of inorganic material; forming a second encapsulation layer by an inkjet process with the second encapsulation layer being made of organic material; and forming a third encapsulation layer by a chemical vapor deposition process with a mask plate shielding the cavity and the third encapsulation layer being made of inorganic material.

Optionally, the forming a cavity through the protection layer and a function layer of the OLED devices in a region where a through hole is to be formed, includes: coating photoresist on the protection layer; exposing and developing the photoresist with a mask plate, thereby exposing a region of the protection layer corresponding to the cavity to be formed; removing the exposed portion of the protection layer and a portion of the function layer corresponding to the exposed portion of the protection layer by plasma; and removing the photoresist remained at the protection layer.

Optionally, after the forming a film encapsulation layer with the film encapsulation layer covering a lateral wall of the function layer of the OLED devices that defines the cavity, the method further includes: forming the though hole in the region corresponding to the cavity with the through hole extending though the film encapsulation layer, the protection layer, the function layer of the OLED devices and the base substrate.

Optionally, after the providing a base substrate and before the forming OLED devices on the base substrate, the method further includes forming a buffer layer on the base substrate.

Optionally, the base substrate is made of polyimide.

One embodiment of the present disclosure provides an OLED display screen that includes: a base substrate, OLED devices, a protection layer and a film encapsulation layer. The OLED devices, the protection layer and the film encapsulation layer are sequentially formed on the base substrate. The OLED display screen further includes a through hole defined through the protection layer, a function layer of the OLED devices and the base substrate. The film encapsulation layer covers a lateral wall of the function layer of the OLED devices that surrounds the through hole.

Optionally, the film encapsulation layer includes a first encapsulation layer, a second encapsulation layer and a third encapsulation layer that are sequentially formed on the protection layer; the first encapsulation layer and the third encapsulation layer are made of inorganic material, and the second encapsulation layer is made of organic material.

Optionally, the OLED display screen further includes a buffer layer between the base substrate and the OLED devices.

BRIEF DESCRIPTION OF THE DRAWINGS

A brief introduction will be given hereinafter to the accompanying drawings which will be used in the description of the embodiments in order to explain the embodiments of the present disclosure more clearly. Apparently, the drawings in the description below are merely for illustrating some embodiments of the present disclosure. Those skilled in the art may obtain other drawings according to these drawings without paying any creative labor.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise indicated. The following description of exemplary embodiments is merely used to illustrate the present disclosure and is not to be construed as limiting the present disclosure.

Figure 1:
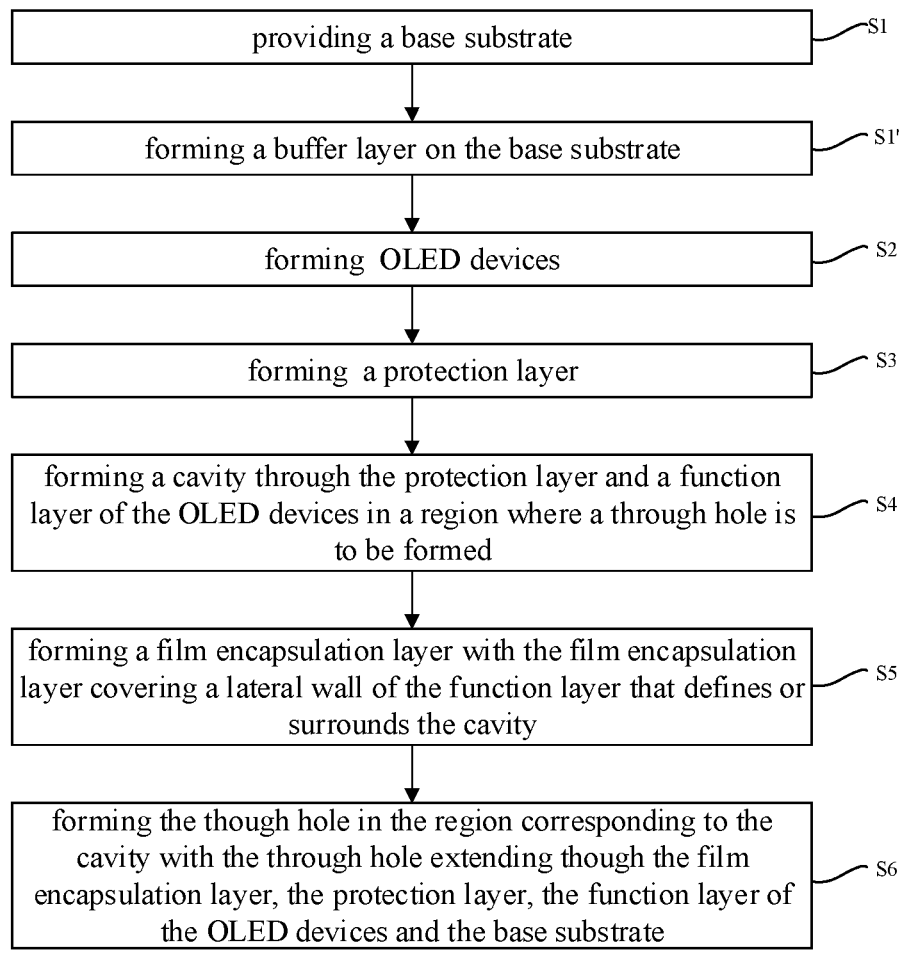
FIG. 1 is a first flow chart of a method for manufacturing an OLED display screen according to an embodiment of the present disclosure.
Figure 6:
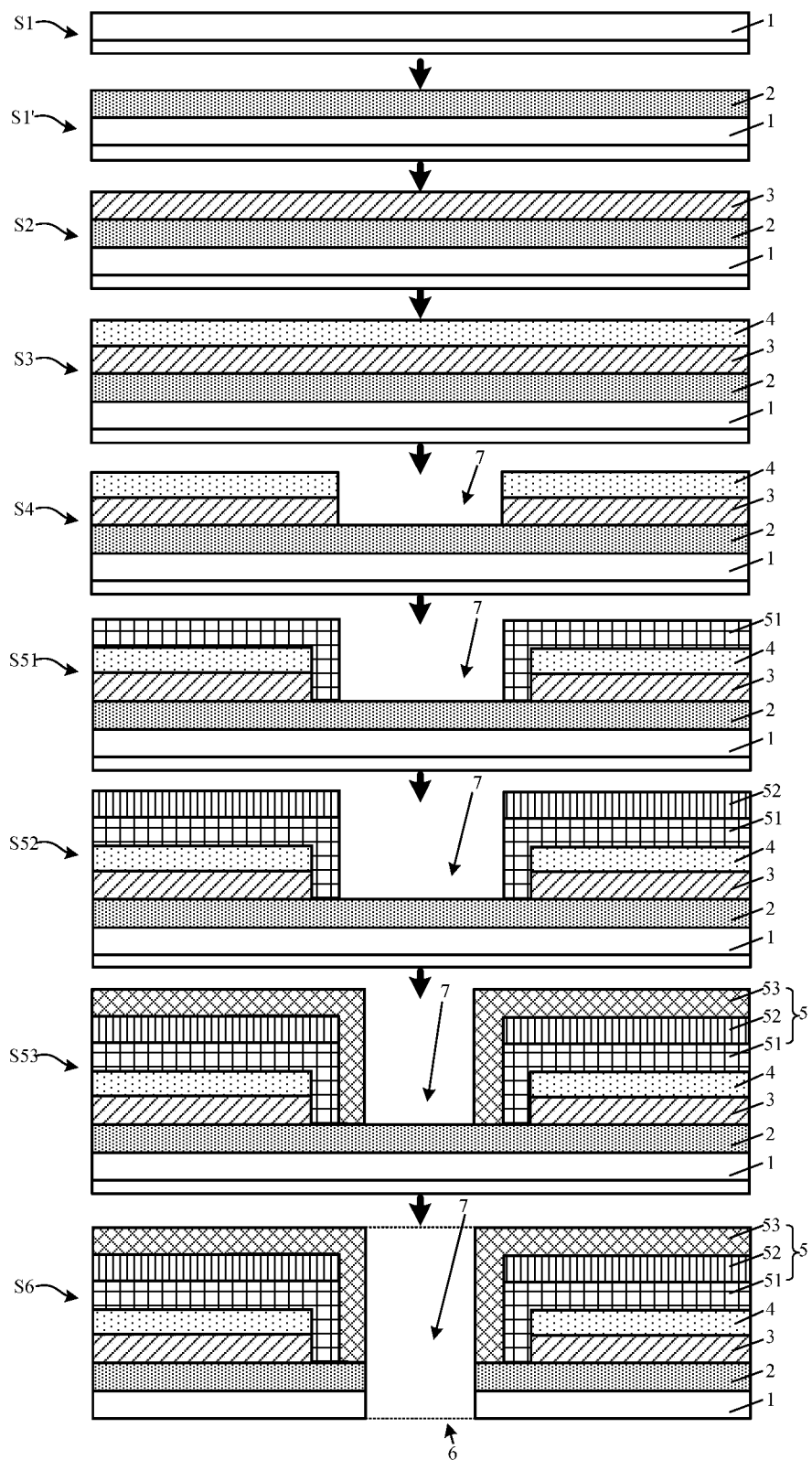
FIG. 6 is a process diagram of a method for manufacturing an OLED display screen according to an embodiment of the present disclosure.

Referring to FIG. 1 and FIG. 6, a method for manufacturing an OLED display screen is provided according to an embodiment of the present disclosure and includes the following steps.

At step S1, a base substrate 1 is provided.

At step S2, OLED devices 3 are formed.

At step S3, a protection layer 4 is formed.

At step S4, a cavity 7 is formed through the protection layer 4 and a function layer of the OLED devices 3 in a region where a through hole 6 is to be formed.

At step S5, a film encapsulation layer 5 is formed with the film encapsulation layer 5 covering a lateral wall of the function layer of the OLED device 3 that defines or surrounds the cavity.

It should be noted that, the method of one embodiment of the present disclosure may be used to manufacture a rigid OLED display screen or a flexible OLED display screen. One example of manufacturing the flexible OLED display screen is described in details hereinafter. Referring to FIG. 1 and FIG. 6, in the step S1, the base substrate 1 may be a flexible base substrate such as a polyimide substrate and the flexible base substrate may be formed on a rigid substrate. The rigid substrate supports the flexible base substrate, there facilitating subsequent formation of the OLED devices and the film encapsulation layer on the flexible base substrate.

Referring to FIG. 1 and FIG. 6, in the step S2, the OLED devices 3 are formed on the flexible base substrate 1. The OLED devices 3 are at a region of the flexible base substrate 1 corresponding to a display region of the OLED display screen. Each OLED 3 includes an anode, an organic light emitting layer and a cathode which are sequentially formed on the flexible base substrate 1. Between the anode and the organic light emitting layer, at least one of a hole injection layer, a hole transfer layer and an electron blocking layer may be sequentially formed on the anode. Between the organic light emitting layer and the cathode, at least one of a hole blocking layer, an electron transfer layer and an electron injection layer may be sequentially formed on the organic light emitting layer. All of the OLED devices 3 on the flexible base substrate 1 may share one cathode. The hole injection layer, the hole transfer layer, the electron blocking layer, the hole blocking layer, the electron transfer layer and the electron injection layer may also be shared by all of the OLED devices 3 on the flexible base substrate 1.

After formation of the OLED devices 3, referring to FIG. 1 and FIG. 6, in the step S3, the protection layer 4 is formed on the OLED devices 3. The protection layer 4 is used to protect the OLED devices 3 from being adversely affected by water and oxygen in subsequent formation of the cavity 7 through the function layer of the OLED devices 3.

Referring to FIG. 1 and FIG. 6, in the step S4, the cavity 7 is formed in the region where the through hole 6 is to be formed. The cavity 7 extends through the protection layer 4 and the function layer of the OLED devices 3.

Referring to FIG. 1 and FIG. 6, in the step S5, the film encapsulation layer 5 is formed. The film encapsulation layer 5 is used to encapsulate the OLED devices 3. The film encapsulation layer 5 covers the lateral wall of the function layer of the OLED device 3, and the lateral wall of the function layer of the OLED device 3 defines or surrounds the cavity 7. In other words, the film encapsulation layer 5 covers portions of the function layer of the OLED device 3 that surround the cavity, thereby encapsulating the function layer of the OLED device 3 and then preventing the function layer of the OLED device 3 from being adversely affected by water and oxygen.

In one embodiment of the present disclosure, after formation of the OLED devices 3 on the base substrate 1, the protection layer 4 is formed on the OLED devices 3, then the cavity 7 is formed through the protection layer 4 and the function layer of the OLED devices 3 in the region where the through hole 6 is to be formed, and then the film encapsulation layer 5 is formed with the film encapsulation layer 5 covering the lateral wall of the function layer of the OLED device 3 that defines or surrounds the cavity 7. In this way, the protection layer 4 can protect the function layer of the OLED devices 3 from being adversely affected when one cavity is formed directly after formation of the OLED devices 3. Meanwhile, after formation of the cavity 7, the formed film encapsulation layer 5 overs the lateral wall of the function layer of the OLED device 3 that defines or surrounds the cavity 7, thus the film encapsulation layer 5 can cover portions of the function layer of the OLED device 3 that are exposed in the cavity 7, thereby encapsulating and protecting these portions of the function layer and then preventing these portions of the function layer from being adversely affected by water and oxygen. Further, in the subsequent formation of the through hole 6, the film encapsulation layer 5 overs the lateral wall of the function layer of the OLED device 3 that defines or surrounds the cavity 7, thus the presence of the through hole 6 will not expose the functional layer of the OLED device 3. Therefore, the method of one embodiment of the present disclosure can prevent the display quality of the OLED display screen from being adversely affected due to the presence of the through hole 6 in the OLED display screen.

In the above embodiment, in the step S4, when forming the cavity 7 through the protection layer 4 and the function layer of the OLED devices 3 in the region where the through hole 6 is to be formed, several ways may be adopted. For example, the cavity 7 may be formed by the etching process. The etching process may be a wet etching process or a dry etching process. In one embodiment, the cavity 7 may be formed by the wet etching process or the ashing process. In one embodiment, the function layer of the OLED devices 3 and the protection layer 4 may be made of non-metallic materials and the dry etching process is usually used to etch one non-metal material in the related art, thus, when the cavity 7 is formed by the dry etching process, the existing production lines may be used and then there is no need to develop another production line. Meanwhile, in the ashing process, when the material to be taken out is removed by the plasma via bombardment, the physical action is greater than the chemical action; since the physical action is faster, the efficiency of forming the cavity 7 can be improved when the cavity 7 is formed by the ashing process.

Figure 3:
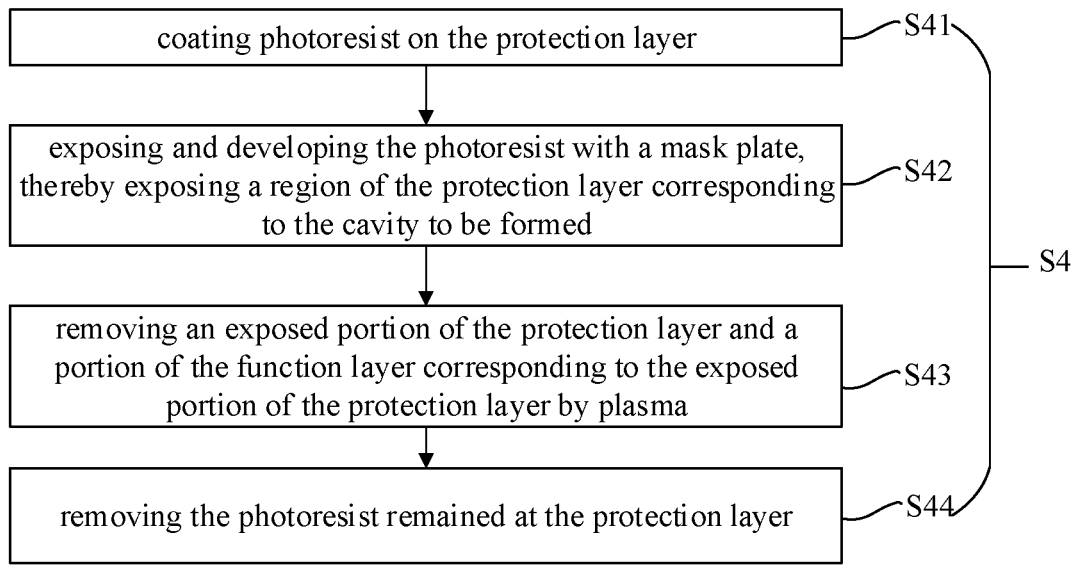
FIG. 3 is a flow chart of a step S4 shown in FIG. 1.

For example, when the protection layer 4 is made of an inorganic material, referring to FIG. 3, in the step S4, forming the cavity through the protection layer and the function layer of the OLED devices includes the following steps.

At step S41, photoresist is coated on the protection layer.

At step S42, the photoresist is exposed and developed with a mask plate, thereby exposing a region of the protection layer corresponding to the cavity to be formed.

At step S43, exposed portions of the protection layer and portions of the function layer corresponding to the exposed portions of the protection layer are removed by plasma.

At step S44, the photoresist remained at the protection layer is removed.

Specifically, after formation of the protection layer, the photoresist is coated on the protection layer; the photoresist is exposed and developed with the mask plate, thereby removing a portion of the photoresist corresponding to the to-be-formed through hole and then exposing the protection layer corresponding to the to-be-formed through hole; then the exposed portions of the protection layer and portions of the function layer corresponding to the exposed portions of the protection layer are removed by plasma which may include carbon tetrafluoride, oxygen and argon; and then the photoresist remained at the protection layer is removed, thereby completing formation of the cavity. When the exposed portions of the protection layer and portions of the function layer corresponding to the exposed portions of the protection layer are removed by plasma, a bombardment angle of the plasma may be adjusted so that one side of the cavity away from the base substrate has a size greater than or equal to a size of one side of the cavity adjacent the base substrate.

When the protection layer 4 is made of an organic material, after formation of the protection layer, the steps of forming the cavity through the protection layer and the function layer of the OLED devices includes are similar to the above steps except for the difference that there is no need to coat photoresist on the protection layer as well as remove the photoresist remained at the protection layer. Specifically, after formation of the protection layer, the protection layer is exposed and developed with a mask plate, thereby removing a portion of the protection layer corresponding to the to-be-formed through hole and then the protection layer corresponding to the to-be-formed through hole is exposed; then the exposed portions of the function layer are removed by plasma, thereby completing formation of the cavity. When the exposed portions of the function layer are removed by the plasma, a bombardment angle of the plasma may be adjusted so that one side of the cavity away from the base substrate has a size greater than or equal to a size of one side of the cavity adjacent the base substrate.

In the above embodiment, the protection layer may be formed in a variety of forms. For example, the protection layer may be formed by the chemical vapor deposition process, thereby enabling the formed protection layer to have high uniformity and improving reliability of the protection layer in protecting the functional layer of the OLED devices.

In the above embodiment, the thickness of the protection layer may be set according to actual needs. For example, in one embodiment, the thickness of the protection layer may be in a range of from 100 nm to 300 nm. As an example, the thickness of the protection layer may be 100 nm, 200 nm, 300 nm and so on. This can prevent weakening of the protection function of the protection layer to the OLED devices caused by uneven thicknesses of the protection layer due to the thickness of the protective layer being too thin (for example, less than 100 nm). Meanwhile, this can prevent increasing of difficulty and time of forming the cavity due to the thickness of the protective layer being too thick (for example, greater than 300 nm).

In the above embodiment, the material of the protection layer may be selected according to actual needs. For example, the material of the protection layer may be an organic material or an inorganic material. In one embodiment of the present disclosure, the protection layer may be made of inorganic material. For example, the protection layer may be made of at least one of silicon nitride, silicon oxide and silicon oxynitride. Such design can reduce the thickness of the protection layer as much as possible and then further reduce the thickness of the OLED display screen while enabling the protection layer to protect the function layer of the OLED devices.

In the above embodiment, in the step S5, when forming the film encapsulation layer, one process of forming the film encapsulation layer may be determined according to structures of the film encapsulation layer. For example, the film encapsulation layer 5 may include a first encapsulation layer 51, a second encapsulation layer 52 and a third encapsulation layer 53. The first encapsulation layer 51 and the third encapsulation layer 53 may be made of inorganic material, and the second encapsulation layer 52 may be made of organic material. In other words, the film encapsulation layer 5 may be a sandwich structure composed of two inorganic material layers and one organic material layer between the two inorganic material layers. At this point, referring to FIG. 2, forming the film encapsulation layer may include the following steps.

At step S51, the first encapsulation layer is formed with a mask plate by the chemical vapor deposition process. The mask plate shields the cavity and the first encapsulation layer is made of an inorganic material.

Figure 2:
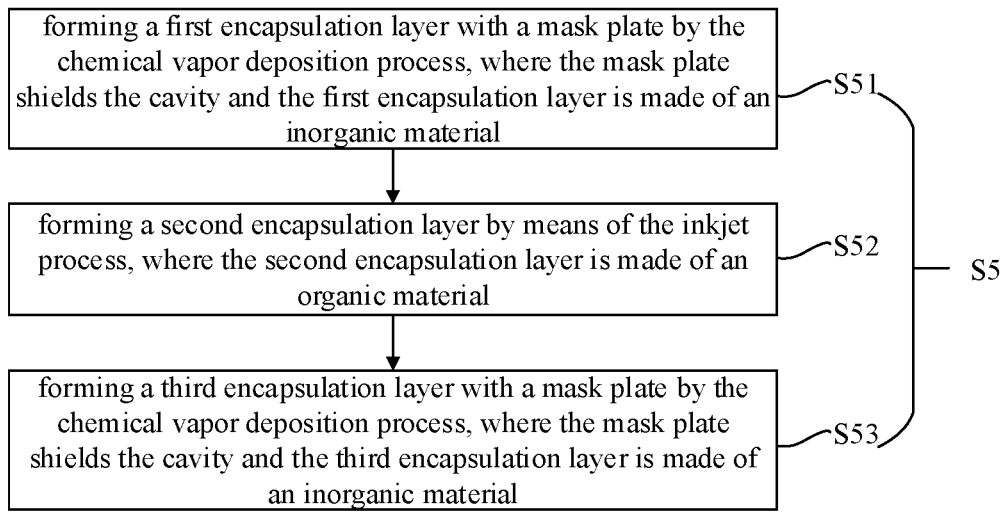
FIG. 2 is a flow chart of a step S5 shown in FIG. 1.

Specifically, referring to FIG. 2 and FIG. 6, the first encapsulation layer is formed by the chemical vapor deposition process with the mask plate shielding the cavity. The first encapsulation layer is made of an inorganic material. For example, the first encapsulation layer may be made of at least one of silicon nitride, silicon oxide and silicon oxynitride. At this point, the first encapsulation layer covers the protection layer and a lateral wall of the cavity, and the first encapsulation layer does not cover a bottom of the cavity. Then in subsequent formation of the through hole, there is no need to remove the first encapsulation layer by means of etching process, thus, the first encapsulation layer is not subject to damage, thereby preventing encapsulation effect of the first encapsulation layer from being adversely affected due to remove of portions of the first encapsulation layer in the process of forming the through hole.

At step S52, the second encapsulation layer is formed by means of the inkjet process. The second encapsulation layer is made of an organic material.

Specifically, referring to FIG. 2 and FIG. 6, the second encapsulation layer is formed on the first encapsulation layer by means of the inkjet process. The second encapsulation layer is made of the organic material. For example, the second encapsulation layer may be made of resin material. When forming the second encapsulation layer by means of the inkjet process, one nozzle corresponding to the cavity is controlled to not spray material so that the second encapsulation layer does not cover the bottom of the cavity. Then in subsequent formation of the through hole, there is no need to remove the second encapsulation layer by means of etching process, thus, the second encapsulation layer is not subject to damage, thereby preventing encapsulation effect of the second encapsulation layer from being adversely affected due to remove of portions of the second encapsulation layer in the process of forming the through hole.

At step S53, the third encapsulation layer is formed with a mask plate by the chemical vapor deposition process. The mask plate shields the cavity and the third encapsulation layer is made of an inorganic material.

Specifically, referring to FIG. 2 and FIG. 6, the third encapsulation layer is formed with the mask plate by the chemical vapor deposition process. The mask plate for forming the third encapsulation layer is the same as the mask plate for forming the first encapsulation layer. The mask plate shields the cavity. The third encapsulation layer is made of an inorganic material. For example, the third encapsulation layer may be made of at least one of silicon nitride, silicon oxide and silicon oxynitride. At this point, the third encapsulation layer covers the second encapsulation layer and the lateral wall of the function layer of the OLED device that defines or surrounds the cavity, and the third encapsulation layer does not cover the bottom of the cavity. Then in subsequent formation of the through hole, there is no need to remove the third encapsulation layer by means of etching process, thus, the third encapsulation layer is not subject to damage, thereby preventing encapsulation effect of the third encapsulation layer from being adversely affected due to remove of portions of the third encapsulation layer in the process of forming the through hole.

Referring to FIG. 1 and FIG. 6, after the step S5, the method further include: at step S6, forming the though hole 6 in the region corresponding to the cavity 7 with the through hole 6 extending though the film encapsulation layer 5, the protection layer 4, the function layer of the OLED devices and the base substrate 1.

Specifically, after formation of the film encapsulation layer, i.e., completing encapsulation of the OLED devices, when the film encapsulation layer does not cover the bottom of the cavity, one portion of the base substrate corresponding to the cavity is removed, thereby forming the through hole that extends though the film encapsulation layer, the protection layer, the function layer of the OLED devices and the base substrate. The through hole extends though the OLED display screen in a thickness direction of the OLED display screen, and is used to mount a camera or a telephone receiver therein. When the base substrate is a flexible base substrate and the flexible base substrate is on a rigid substrate, after formation of the film encapsulation layer, one portion of the flexible base substrate corresponding to the cavity is removed by the dry etching process, thereby forming the through hole that extends though the film encapsulation layer, the protection layer, the function layer of the OLED devices and the flexible base substrate. Then, the flexible base substrate is separated from the rigid base substrate, thereby forming the OLED display screen. When the base substrate is a rigid base substrate, after formation of the film encapsulation layer, one portion of the rigid base substrate corresponding to the cavity is removed by the dry etching process, thereby forming the through hole that extends though the film encapsulation layer, the protection layer, the function layer of the OLED devices and the rigid base substrate and then forming the OLED display screen.

Referring to FIG. 1 and FIG. 6, after the step S1 and before the step 2, the method further includes: at step S1', forming a buffer layer 2 on the base substrate.

The OLED display screen formed according to the method of one embodiment of the present disclosure may be a rigid OLED display screen or a flexible OLED display screen. When the OLED display screen formed according to the method of one embodiment of the present disclosure is a flexible OLED display screen, the base substrate is a flexible base substrate. In order to prevent compositions of the flexible base substrate from adversely affecting the anode of the OLED device when the anode of the OLED device is directly formed on the flexible base substrate, one buffer layer may be formed on the base substrate and then the subsequently formed anode of the OLED device is on the buffer layer. The buffer layer separates the anode and the base substrate, thereby preventing the compositions of the flexible base substrate from adversely affecting the anode of the OLED device, for example, preventing organic molecules of the flexible base substrate from moving to the anode to cause deterioration of conductivity of the anode.

When the OLED display screen formed according to the method of one embodiment of the present disclosure is a flexible OLED display screen, the base substrate is a flexible base substrate. At this point, the flexible base substrate may be made of polyimide.

Figure 4:
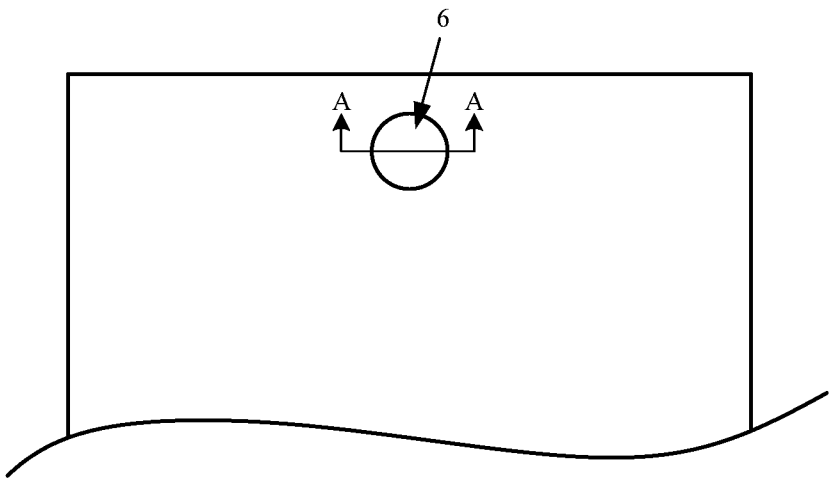
FIG. 4 is a schematic plan view of an OLED display screen according to an embodiment of the present disclosure.
Figure 5:
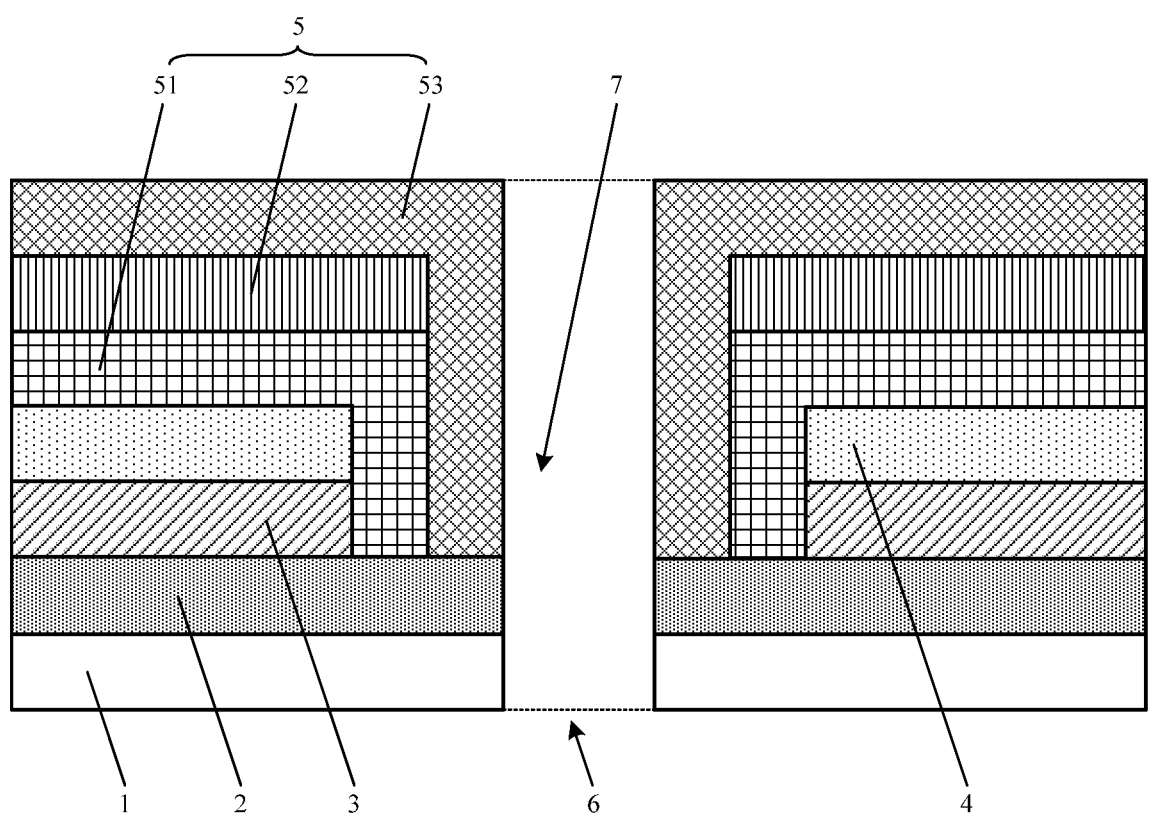
FIG. 5 is a cross-sectional view taken along a line A-A of FIG. 4.

Referring to FIG. 4 and FIG. 5, one embodiment of the present disclosure further provides an OLED display screen. The OLED display screen may be manufactured according to the above method. The OLED display screen includes OLED devices 3, a protection layer 4 and a film encapsulation layer 5 that are sequentially formed on a base substrate 1. A cavity 7 is defined through the protection layer 4 and a function layer of the OLED devices 3 in a region where a through hole 6 is to be formed. The film encapsulation layer 5 covers a lateral wall of the function layer of the OLED device 3 that defines or surrounds the cavity 7. In other words, the film encapsulation layer 5 covers portions of the function layer of the OLED device 3 that surrounds the though hole 6.

The OLED display screen and the above method have the same or similar advantages with respect to the related art, which will not be elaborated herein.

Referring to FIG. 5, in one embodiment, the film encapsulation layer 5 may include a first encapsulation layer 51, a second encapsulation layer 52 and a third encapsulation layer 53 that are sequentially formed on the protection layer 4. The first encapsulation layer 51 and the third encapsulation layer 53 may be made of inorganic material, and the second encapsulation layer 52 may be made of organic material.

Referring to FIG. 5, in one embodiment, the OLED display screen may be a flexible OLED display screen. At this point, the OLED display screen further includes a buffer layer 2 between the base substrate 1 and the OLED devices 3. The buffer layer 2 separates the base substrate 1 from the OLED devices 3.

It should be noted that, since the OLED display screen may be manufactured according to the above method, thus, the OLED display screen of one embodiment of the present disclosure includes at some features of the above method, thus features of the OLED display screen may be referred to the above description of the method.

The various embodiments in the present disclosure are described in a progressive manner, and each embodiment focuses on differences from other embodiments, and the same similar parts between the various embodiments may be referred to each other.

The above are merely the preferred embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure.

What is claimed is:

1. An organic light emitting diode (OLED) display screen comprising:
    a base substrate;
    a buffer layer on the base substrate;
    OLED devices;
    a protection layer; and
    a film encapsulation layer;
    wherein the buffer layer, the OLED devices, the protection layer and the film encapsulation layer are sequentially formed on the base substrate;
    wherein the OLED display screen further includes a through hole defined through the buffer layer, the protection layer, a function layer of the OLED devices and the base substrate; and
    wherein the film encapsulation layer covers a lateral wall of the function layer of the OLED devices that surrounds the through hole;
    wherein the function layer has a first surface and a second surface; the first surface and the second surface are two opposite surfaces of the function layer; the first surface is in direct contact with the buffer layer; the lateral wall is located between the first surface and the second surface, and is adjacent the through hole;
    the protection layer is directly formed on the second surface and has a lateral surface adjacent the through hole;
    the film encapsulation layer includes a first portion and a second portion; the first portion is in direct contact with a surface of the protection layer distal to the second surface; the second portion extends from the first portion; the second portion covers the lateral wall and the lateral surface; the second portion is in direct contact with the lateral wall and the lateral surface.

2. The OLED display screen of claim 1, wherein the film encapsulation layer includes a first encapsulation layer, a second encapsulation layer and a third encapsulation layer that are sequentially formed on the protection layer; the first encapsulation layer and the third encapsulation layer are made of inorganic material, and the second encapsulation layer is made of organic material.

3. The OLED display screen of claim 1, wherein the second portion is in direct contact with the buffer layer.

4. The OLED display screen of claim 3, wherein the second portion is perpendicular to the first portion and the base substrate.

5. The OLED display screen of claim 2, wherein the first encapsulation layer includes a first extension portion and a second extension portion; the first extension portion is in direct contact with the surface of the protection layer distal to the second surface; the second extension portion extends from the first extension portion; the second extension portion covers the lateral wall and the lateral surface; the second extension portion is in direct contact with the lateral wall and the lateral surface.

6. The OLED display screen of claim 5, wherein the second encapsulation layer is directly formed on a surface of the first extension portion distal to the surface of the protection layer.

7. The OLED display screen of claim 6, wherein the third encapsulation layer includes a third extension portion and a fourth extension portion; the third extension portion is directly formed on a surface of the second encapsulation layer distal to the surface of first extension portion; the fourth extension portion extends from the third extension portion; the fourth extension portion covers a lateral side of the second encapsulation layer and a lateral side of the second extension portion; the fourth extension portion is in direct contact with the lateral side of the second encapsulation layer and the lateral side of the second extension portion.

8. The OLED display screen of claim 7, wherein the second extension portion is perpendicular to the first extension portion and is in direct contact with the buffer layer; and the fourth extension portion is perpendicular to the third extension portion and is in direct contact with the buffer layer.

* * * * *

UNITED STATES PATENT AND TRADEMARK OFFICE
CERTIFICATE OF CORRECTION

PATENT NO. : 10,930,886 B2
APPLICATION NO. : 16/222043
DATED : February 23, 2021
INVENTOR(S) : Ke Dai et al.

Page 1 of 1

It is certified that error appears in the above-identified patent and that said Letters Patent is hereby corrected as shown below:

On the Title Page

Delete:
"(73) Assignees: BOE TECHNOLOGY GROUP CO., LTD., Beijing (CN); CHENGDU BOE OPTOELECTRONICS TECHNOLOGY CO.. LTD., Sichuan (CN)"

And Insert:
--(73) Assignees: BOE TECHNOLOGY GROUP CO., LTD., Beijing (CN); CHENGDU BOE OPTOELECTRONICS TECHNOLOGY CO., LTD., Sichuan (CN)--.

Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*